United States Patent
Bastian

[11] 3,970,974
[45] July 20, 1976

[54] TRIMMER FOR A TUNED UHF LINE

[75] Inventor: Elmer Bastian, Union, Ill.

[73] Assignee: Oak Industries Inc., Crystal Lake, Ill.

[22] Filed: Apr. 24, 1974

[21] Appl. No.: 463,782

Related U.S. Application Data

[63] Continuation of Ser. No. 307,929, Nov. 20, 1972, abandoned.

[52] U.S. Cl. .................... 334/45; 317/249 T; 325/459; 334/78
[51] Int. Cl.² ........................................ H03J 3/20
[58] Field of Search ........... 325/383, 387, 452–454, 325/458–462, 464, 465; 317/249 T; 334/45, 70; 336/136

[56] References Cited
UNITED STATES PATENTS

| | | | |
|---|---|---|---|
| 2,095,420 | 10/1937 | Polydoroff | 336/136 |
| 3,286,139 | 11/1966 | Edwards | 317/249 T |
| 3,643,168 | 2/1972 | Manicki | 325/459 |

OTHER PUBLICATIONS

The Radio Amateur's Handbook, 48th ed., 1971 p. 54.
Reference Data for Radio Engineers, 4th ed., 1956 pp. 124–125.

*Primary Examiner*—George H. Libman
*Attorney, Agent, or Firm*—Kinzer, Plyer, Dorn & McEachran

[57] ABSTRACT

A UHF tuner employing resonant cavities with tuned lines has a discrete air trimmer capacitor which includes a fixed electrode connected to the tunable line with one or more insulated turns of silver wire and a movable electrode guided into the fixed electrode to provide characteristics of lower minimum capacity, higher maximum to minimum capacity ratio, smaller physical size, higher Q and lower cost than conventional capacitor trimmers.

6 Claims, 2 Drawing Figures

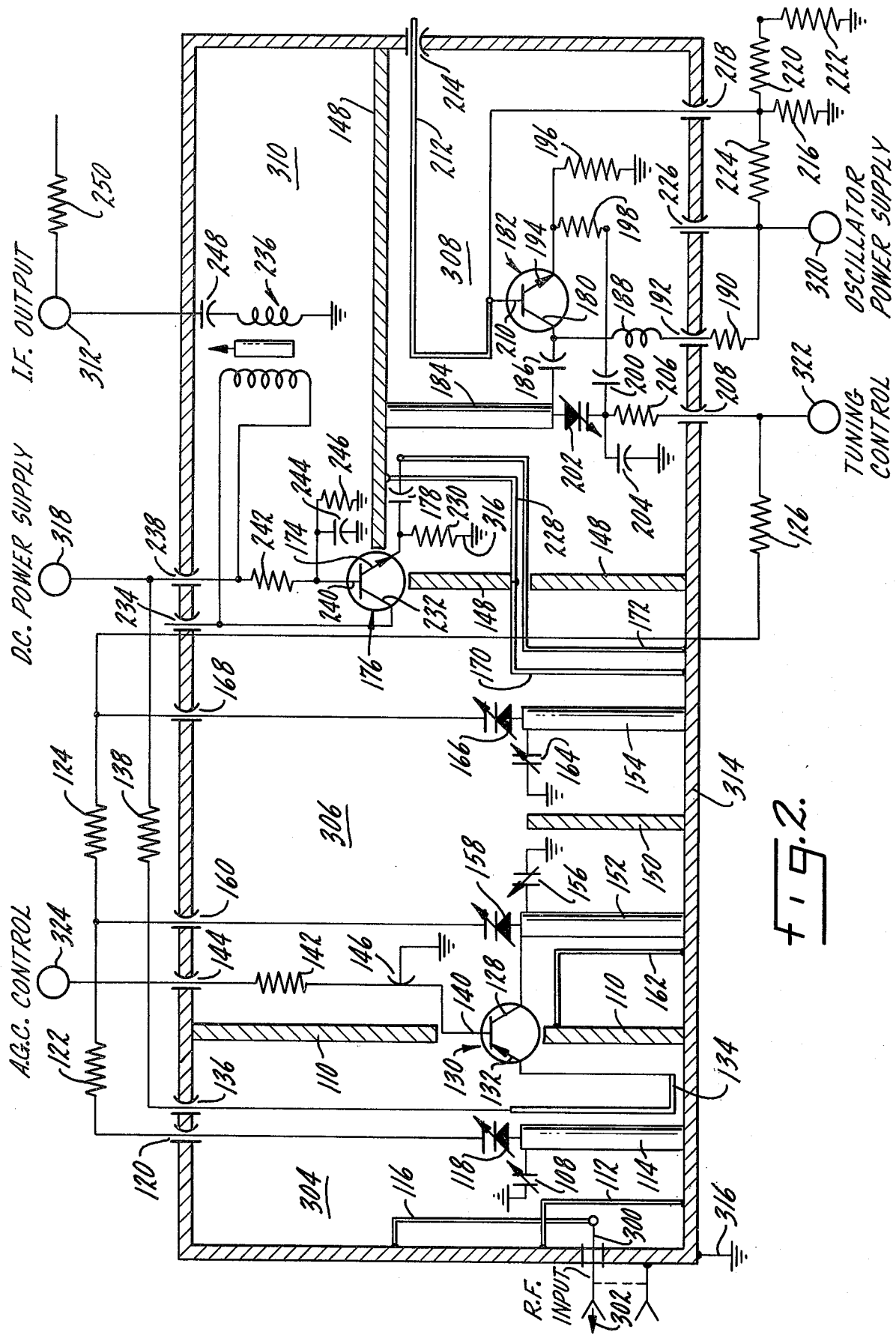

TRIMMER FOR A TUNED UHF LINE

This is a continuation of application Ser. No. 307,929 filed Nov. 20, 1972 now abandoned.

SUMMARY OF THE INVENTION

The present invention relates to UHF tuners employing resonant cavities and is concerned with an improved trimmer capacitor that aids in tuning the resonant cavity.

A primary object is a trimmer capacitor that requires no dielectric body for mechanical support of the fixed electrode and movable electrode of the trimmer.

Another object is a trimmer capacitor that exhibits lower minimum capacity than conventional trimmers.

Another object is a trimmer capacitor that has a higher maximum to minimum capacity ratio than conventional trimmers.

Another object is a trimmer capacitor of smaller physical size than conventional trimmers.

Another object is a trimmer capacitor with a higher Q or lower dissipation factor than conventional trimmers.

Other objects will appear from time to time in the ensuing specification, drawings and claims.

BRIEF DESCRIPTION OF THE DRAWINGS

FIG. 2 is an electrical circuit diagram of a UHF tuner that includes the improved trimmer capacitor.

BRIEF DESCRIPTION OF THE INVENTION

Figure 1:
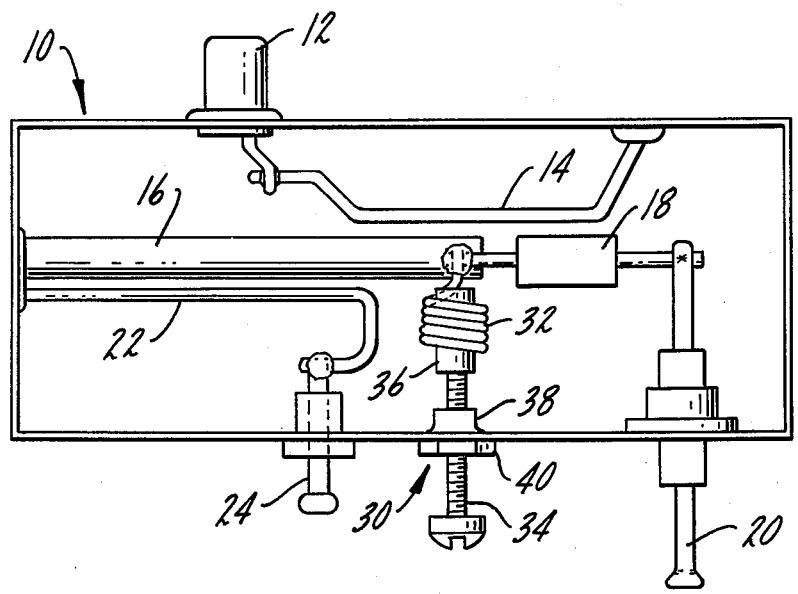
FIG. 1 is a view with parts broken away of the invention as employed in a resonant cavity of a UHF tuner.

The trimmer capacitor will be described as it relates to its use in a UHF tuner with UHF tuning cavities, one of which is shown in FIG. 1. The UHF tuning cavity 10 includes an RF input 12 fastened to the walls of the tuning cavity. An RF tuning loop 14 is formed from a piece of wire having one end connected to the RF input 12 and its other end connected to a grounded point on the UHF tuning cavity wall. A tuning line 16 has one end connected to the grounded cavity wall and the other end connected to a varactor diode 18. The varactor diode 18 in turn is connected to a control voltage terminal input 20. An RF output loop 22, formed from a piece of wire, has one end connected to the grounded cavity wall with the other end connected to an RF output terminal 24. A trimmer capacitor 30 is connected between the junction of the tuning line 16 and the varactor diode 18 and the supporting cavity wall.

The tuning line 16, a transmission line, tunes the UHF tuning cavity 10 to the approximate frequency and the varactor diode 18 tunes the cavity over the UHF frequency range as its control voltage 20 is varied. Although the voltage-capacity characteristics of the varactor diode 18 performs the major portion of the tuning over the UHF band, the trimmer capacitor 30 is required to accomplish tracking at the high frequency end of the UHF band with other tuning cavities in the UHF tuner employing similar varactor diodes and trimmer capacitor tuning means. The trimmer capacitor brings all cavities into exact correspondence at CH 83.

The trimmer capacitor 30 includes a fixed electrode 32 formed of one or more insulated turns of wire soldered to the tuning line 16 and a movable electrode 34 formed by a screw guided into the fixed electrode 32 by an insulated sleeve 36. The wire used for the fixed electrode may be silverplated although other wire is equally satisfactory. Studs or movable electrodes other than a screw are also satisfactory. The movable electrode 34 is electrically grounded and supported by the UHF cavity by means of a tapped extruded hole 38 in the UHF cavity 10. A hardened steel tension nut 40 may be provided to insure a good RF ground and to secure the movable electrode 34 after it has been adjusted. The capacity that appears at the UHF tuning line 16 is trimmed or varied by turning the movable electrode 34 causing it to move in and out of the fixed electrode 32.

Conventional trimmers require a dielectric body such as ceramic having ample material to support both the movable and fixed electrode. The effect of the required dielectric body is to lower the Q or increase the dissipation factor, increase the minimum capacity, increase the physical size of the entire trimmer and also increase the cost due to the requirement of the dielectric body. The conventional trimmer also has a fixed electrode fabricated as a solid piece of material rather than as a number of turns of wire and requires an additional piece of material such as a metal ribbon to electrically connect the fixed electrode to the tuning line. The dielectric ceramic body of a conventional trimmer capacitor has a dielectric constant between 8 and 9 times that of air which results in a capacity minimum for a given mechanical size that is much greater than is obtainable with an air trimmer. The Q is also lowered because of the additional dielectric loss introduced by the ceramic.

The UHF tuner of FIG. 2 receives UHF television signals via an antenna system and selects individual channels by means of a tunable wave filter. Operating as a conventional hetrodyne receiver, the signals are converted to an intermediate frequency by hetrodyning the oscillator and signal frequencies in a mixer. The difference frequency generated by the hetrodyne action, which is amplified by the mixer and band shaped by an output transformer, is the IF output.

The UHF tuner includes an RF input 300 which connects to an external antenna 302, an antenna tuning section 304, an interstage tuning section 306 between the antenna tuning section 304 and the oscillator tuning section 308, a mixer and output tuning section 310, and an IF output 312. The various sections are resonant cavities mechanically defined by shields at various points in the metal chassis 314 which is grounded at 316.

The UHF tuner also includes a DC power supply input 318 which supplies the antenna tuning section 304, the interstage tuning section 306 and the mixer and output tuning section 310. The DC supply 318 may be the 20 volts DC shown or other suitable values. The oscillator tuning section 308 has an independent DC power supply input 320 which may also be 20 volts DC. A tuning control input 322 is varied externally from approximately 2.5 to 23 volts DC by means of external tuning selection. An AGC control input 324 may also be included to facilitate gain control of the circuitry in the antenna tuning section 304.

The antenna tuning section 304 of the UHF tuner is defined by the chassis 314 and the metal shield 110, both of which are plated with a conductive metal. An antenna tuning loop 112 formed from a piece of wire is connected between two suitable points on the chassis 314 as determined by calculation and experimentation to aid in tuning the antenna tuning section 304. A transmission line 114 forms the antenna resonator with chassis 314, shield 110 and a matal cover that is not shown which is placed over the chassis. An antenna input loop 116 is also made from a piece of wire and is connected between a suitable point on the chassis 314 and the antenna tuning section input 300. The anode of antenna tuning varactor 118 and one end of a trimmer capacitor 108 of the type in FIG. 1 whose other end is connected to ground 316 are connected to the antenna tuning line 114. The cathode of varactor 118 is connected through the chassis 314 by means of a by-pass capacitor 120 and then through series-connected resistors 122, 124 and 126 to the tuning control input 322. The output of the antenna tuning section 304 is the collector 128 of a transistor 130 connected as an RF amplifier. The emitter 132 of RF amplifier transistor 130 is connected through an RF input loop 134 and through the chassis by means of by-pass capacitor 136 to DC supply 318 through resistor 138. The base 140 of transistor 130 is connected through resistor 142 to the AGC control 324 and passes through the chassis 314 through by-pass capacitor 144. The base 140 is also connected to the chassis 314 through a by-pass capacitor 146.

The collector 128 of RF amplifier transistor 130 is the input of the interstage tuning section 306 which is mechanically defined by the chassis 314, the metal shield 110, the metal shield 148 and the circuitry of the mixer output tuning section 310. Another metal shield 150 is located within the interstage tuning section 306 and between an RF output tuning line 152 and a mixer input tuning line 154 which are both transmission lines sections so as to divide the interstage tuning section into two areas. One end of the RF output tuning line 152 is connected to the chassis 314 with the other end connected to the collector 128 of RF amplifier transistor 130, to the chassis ground through a trimmer capacitor 156 of the type in FIG. 1 and to the anode of RF output tuning varactor 158. The cathode of varactor 158 is connected through the chassis by means of by-pass capacitor 160 to the tuning control 322 through series resistors 124 and 126. An RF tuning loop 162 is located near the RF output tuning line 152 between the chassis 314 and the metal shield 110 at a point near the RF amplifier transistor 130. The mixer input tuning line 154 has one end connected to the chassis 314 and the other end connected to chassis ground through a trimmer capacitor 164 of the type in FIG. 1 and to the cathode of mixer input tuning varactor 166. The anode of varactor 166 is connected through the chassis by means of by-pass capacitor 168 of the tuning control 322 through series resistor 126. Located near the mixer input tuning line 154 is a mixer tuning loop 170 that has one end connected to the chassis and the other end connected to the shield 148. The output of the interstage tuning section 206, the mixer input loop 172, has one end connected to the chassis 314 with the other end passing through the metal shield 148 and connected to the emitter 174 of mixer transistor 176 through capacitor 178.

The oscillator tuning section 308 adjoins the interstage tuning section 306 and is mechanically defined by the chassis 314 and the metal shield 148. The collector 180 of oscillator transistor 182 is connected to one end of the oscillator tuning line 184 through coupling capacitor 186 and also to the oscillator power supply 320 through a series connection of a coil 188 and a resistor 190 and through the chassis 314 by means of a by-pass capacitor 192. The emitter 194 of oscillator transistor 182 is connected to ground 316 through resistor 196 and to one end of a resistor 198. The other end of resistor 198 is connected through a coupling capacitor 200 to the cathode of oscillator tuning varactor 202 whose anode is connected to the oscillator tuning line 184. The cathode of oscillator tuning varactor 202 is also connected to ground 306 through a capacitor 204 and to the tuning control 322 through resistor 206 and through the chassis by means of a by-pass capacitor 208. The base 210 of oscillator transistor 182 is connected through the oscillator AFC loop 212 whose other end is connected to a by-pass capacitor 214 mounted in the chassis 314. The base 210 is also connected to ground through resistor 216 after passing through the chassis by means of by-pass capacitor 218. Also connected at the ungrounded end of resistor 216 is a series resistor compensation network with resistor 220 and resistor 222 connected to ground 316 and to the oscillator power supply voltage 320 through resistor 224. The oscillator power supply voltage 320 is also connected to the chassis 314 through by-pass capacitor 226. An oscillator tuning loop 228 is connected between two suitable points on the chassis 314 near the mixer input loop 172 and the oscillator tuning line 184.

The mixer and output tuning section 310, adjoining the oscillator tuning section 308, is defined by the chassis 314 and metal shield 148. As described above, the emitter 174 of mixer transistor 176 is the input of the mixer and output tuning section 310 and is connected to ground 316 through a resistor 230. The collector 232 of mixer transistor 176 is connected to the chassis 314 through capacitor 234 and also to one end of the primary winding of the IF output transformer 236. The other end of the primary winding is connected through the chassis by means of by-pass capacitor 238 to the power supply 318, and to the base 240 of mixer transistor 176 through a resistor 242. The base 240 of mixer transistor 176 is also connected to ground 316 through the parallel combination of a capacitor 244 and a resistor 246. The secondary winding of the tunable IF transformer 236 has one end connected to ground 316 and the other end connected through coupling capacitor 248 to the output of the UHF tuner, the IF output 312. A matching resistor 250 may be connected to the IF output 312 as determined by the characteristics of the circuit to be connected at the output. A cover which is not shown fits over the entire UHF tuner chassis 314 to provide shielding and isolation between the various stages.

In operation, the tuning control input 322 varies the DC voltage to the varactors 118, 158, 166 and 202 by means of a tuner selector which is external to the UHF tuner. The various sections and their associated circuitry are maximally tuned to the desired channel, channel 14 through channel 83, for optimum IF output at 312 and optimum rejection of undesired RF signals that are present at the antenna 302 and the RF input 300.

The UHF television signals at the antenna 302 enter the UHF tuner at the RF input 300. The antenna input loop 116 facilitates in the coupling of the RF energy to the antenna tuning line 114 which is tuned to desired frequency by the antenna tuning varactor 118 and the antenna trimmer capacitor 108. The antenna tuning loop 112 aids in tuning the section 304 to the proper frequency at a given control input voltage. The resonant frequency to which the cavity is tuned is determined by the tuning voltage at the tuning control input 322 which is impressed across the varactor 18 through the bias network, resistors 122, 124 and 126. The capacity-voltage characteristics of the varactor 118 varies the reactance of the combination of antenna tuning line 114, varactor 118 and trimmer capacitor 108 which thereby changes the resonant frequency of the combination.

The RF energy in the resonant cavity section 304 is then coupled to the RF amplifier transistor 130 by the RF input loop 134 which is connected to the emitter 132. The amplified RF signal is then coupled from collector 128 of RF amplifier transistor 130 to the interstage tuning section 306 at the RF output tuning line 152. The RF tuning loop 162 aids in tuning the interstage tuning section 306 to the correct frequency. The interstage tuning section 306 also includes a mixer input tuning line 154 in addition to the RF output tuning line 152 which form mutually coupled resonators within the chassis 314, shields 110, 150 and 148, and the metal cover of the UHF tuner. The shield 150 between the tuning lines 152 and 154 divides the interstage tuning section 306 into two separate resonators and also controls the amount of mutual coupling between the lines. The frequency to which the mutually coupled resonators are tuned is determined by the tuning control voltage at 322 and the RF output tuning varactor 158, the mixer input tuning varactor 166 and trimmer capacitors 156 and 164 in the same way as the antenna tuning section 304.

The RF energy in the interstage tuning section 306 is then coupled to the mixer stage including mixer transistor 176 by means of the mixer input loop 172 which extends from the second resonant cavity near the mixer input tuning line 154 through shield 148 into the oscillator tuning section 308 where it is connected to the emitter 174 of mixer transistor 176 through coupling capacitor 178. The mixer tuning loop 170, which is connected between the chassis 314 near the mixer tuning line 154 and the metal shield 148 in the second resonant cavity, aids in tuning the interstage tuning section 306 to the proper frequency.

The emitter 174 of mixer transistor 176 is located within the oscillator tuning section 308 where the oscillator RF energy is coupled to the mixer transistor 176 from the oscillator resonator which includes the oscillator tuning line 184, the chassis 314, the metal shield 148 and the UHF tuner cover. The tuning of the oscillator resonator is determined by the tuning control voltage 322 impressed across oscillator tuning varactor 202 in the same way as the previous sections. The oscillator tuning loop 228 connected between two points on the metal shield 148 aids in tuning the oscillator resonator to the proper frequency. The oscillator resonant frequency and the RF input frequency from the interstage tuning section 306 are both present at the emitter 174 of the mixer transistor 176 with the mixer and output tuning section 310 tuned to the difference mixing product of the RF input frequency and the oscillator frequency. The difference product obtained from the mixing operation is coupled through IF output transformer 236 as the IF output 312.

A trimmer capacitor with a lower minimum capacity, reduced losses and smaller mechanical size is important in solid state tuners since the other components are very small and trimmer size greatly affects the overall dimensions of the UHF tuner. Since the varactor diodes and transistors are more uniform in capacity as seen at their terminals due to their small size, a given cavity requires a very small capacity increment for tuning. This also requires optimizing the minimum capacity of a trimmer such as to obtain one-quarter pf or less at 878 mhz. The improved air trimmer meets this requirement while the conventional trimmer does not. Components with minimum circuit loss are also desirable because varactor tuning diodes are more lossy than the air tuning gang capacitors previously utilized in UHF tuners.

Whereas the preferred form of the invention has been shown and described herein, it should be realized that there may be many modifications, alterations and substitutions thereto.

I claim:

1. In a UHF tuner, a chassis, at least two cavities in the chassis, shields between said cavities, one of said cavities including an antenna resonator, another of said cavities including mutually coupled RF amplifier and mixer resonators, a shield between said mutually coupled RF amplifier and mixer resonators, a trimmer capacitor having minimum capacity near the upper end of the UHF band in each of said cavities having a resonator, said trimmer capacitor including a fixed electrode connected to said resonator and formed from a plurality of helically arranged insulated turns of wire, an insulating sleeve mounted inside said turns of wire and defining a central passage, a movable electrode positioned to move in and out of the central passage of said fixed electrode, and support means for said movable electrode.

2. The structure of claim 1 further characterized by a sleeve mounted inside said central passage of said fixed electrode and including a central passage in which said movable electrode is positioned as it moves in and out.

3. The structure of claim 2 further characterized in that said movable electrode is a screw.

4. The structure of claim 3 further characterized in that said support means of said movable electrode is a tapped extruded hole in said chassis.

5. The structure of claim 4 further characterized by a tension nut threaded on said movable electrode for securing said movable electrode after it has been positioned at the desired point.

6. In a resonant cavity usable at UHF frequencies, a resonator, a trimmer capacitor having minimum capacity near the upper end of the UHF band and including a fixed electrode connected to said resonator and formed from a plurality of helically arranged insulated turns of wire, an insulating sleeve mounted inside said turns of wire and defining a central passage, a movable electrode positioned to move in and out of the central passage of said fixed electrode, and support means for said movable electrode.

* * * * *